United States Patent [19]

Suzuki et al.

[11] 4,334,220

[45] Jun. 8, 1982

[54] DISPLAY ARRANGEMENT EMPLOYING A MULTI-ELEMENT LIGHT-EMITTING DIODE

[75] Inventors: Ryoichi Suzuki, Kawasaki; Takashi Uchiyama, Kanagawa; Kazuya Hosoe, Machida; Tokuichi Tsunekawa, Kanagawa, all of Japan

[73] Assignee: Canon Kabushiki Kaisha, Tokyo, Japan

[21] Appl. No.: 143,448

[22] Filed: Apr. 24, 1980

Related U.S. Application Data

[63] Continuation of Ser. No. 22,643, Mar. 21, 1979, abandoned, which is a continuation of Ser. No. 818,217, Jul. 22, 1977, abandoned.

[30] Foreign Application Priority Data

Jul. 29, 1976 [JP] Japan ................................. 51-90737

[51] Int. Cl.³ .............................................. G06F 3/14
[52] U.S. Cl. ..................................... 340/753; 354/53; 354/289; 340/782; 340/718
[58] Field of Search ............... 340/753, 754, 782, 718; 354/289, 53

[56] References Cited

U.S. PATENT DOCUMENTS

| | | | |
|---|---|---|---|
| 3,843,249 | 10/1974 | Kitaura | 354/289 |
| 3,903,530 | 9/1975 | Taguchi et al. | 354/289 |
| 3,979,743 | 9/1976 | Moore | 340/753 |
| 3,987,392 | 10/1976 | Kugelmann et al. | 340/753 |
| 4,017,796 | 4/1977 | Tobias | 340/753 |
| 4,039,956 | 8/1977 | Shimanek et al. | 340/753 |
| 4,074,292 | 2/1978 | Nakamoto | 340/753 |

Primary Examiner—Marshall M. Curtis
Attorney, Agent, or Firm—Toren, McGeady & Stanger

[57] ABSTRACT

A display device comprising a first semiconductor stripe and a second stripe of composite structure in which a great number of successive areas alternate between a semiconductor material having different type with respect to that of the first stripe and an insulating material or materials and which is positioned in side-by-side contact relation to the first stripe to establish P-N junctions. A resistor stripe connected lengthwise to the second stripe so that a voltage proportional to a value of information which is desired to be displayed is applied across a third stripe when first stripe is negatively biased, a corresponding number of successive semiconductor areas in the second stripe are caused to emit visible light, giving a viewer the impression of a continuous luminous stripe having a length representative of the information value.

10 Claims, 7 Drawing Figures

(a)

(b)

DISPLAY ARRANGEMENT EMPLOYING A MULTI-ELEMENT LIGHT-EMITTING DIODE

This is a continuation of application Ser. No. 22,643, filed Mar. 21, 1979, now abandoned, which is a continuation of application Ser. No. 818,217, filed July 22, 1977, now abandoned.

BACKGROUND OF THE INVENTION

This invention relates to display devices of semiconductor structure, and, more particularly, to a display device for displaying photographic information in analogue form.

In constructing a display system for displaying photographic information in the field of view of a camera finder, use has been made of a galvanometer with its pointer being supported very delicately so as to be responsive to minute variation of current flowing through the coil of the galvanometer. This mechanical structure gives rise to a high possibility of occurrence of damage at the supporting of the pointer.

A trend in recently developed cameras is, therefore, to employ an array of light-emitting diodes instead of galvanometer for the display purposes. Unlike the galvanometer, the light emitting diode is characterized by certain features, such as the feature that the display can be read out in a dark environment, since visible light emanates from the energized light-emitting diode and the feature that it is possible for the diode to operate with intermittent energization. In addition thereto, there is no possibility of occurrence of the type of damage which would be otherwise encountered when the galvanometer is used, because of the lack of mechanically movable parts. Thus, the durability is remarkably improved. Furthermore, such LED system occupies less space allowing, in general, far more available space in the camera.

The conventional display system using such light-emitting diodes, though providing for many advantages over the galvanometer as described above, are, however, generally designed to display a value of information not in analogue form but in digital form, thereby giving rise the production of other problems. For example, in the case of the dot type display system, it is required to increase the number of light-emitting diodes necessary when the number of values available for a single information is increased. If an intermediate value between two successive available values is desired to be displayed more accurately, (such as corresponding to two light-emitting diodes positioned adjacent to each other which are rendered effective for display), it is impossible to read out how much and to which of these two values the particular intermediate value approaches. In the alternative, in a digital display system using seven-segment read-out elements of light-emitting diode structure for direct display of numeral characters, there is a disadvantage that it takes a somewhat long time to read out the displayed value.

Accordingly, the present invention has for its general object to provide a novel display device of light-emitting diode structure which overcomes the above-mentioned drawbacks of the conventional display system using the light-emitting diodes as the read-out elements and which can display information not in digital form but in a nearly analogue form.

A first object of the present invention is to obtain a single light-emitting diode structure capable of varying the length of a continuous luminous zone.

A second object of the present invention is to provide for nearly analogue display within the field of view of a camera finder by use of the aforesaid light-emitting diode structure.

These and other objects and features of the present invention will become apparent from the following detailed description taken in conjunction with the accompanying drawings.

DETAILED DESCRIPTION OF THE PREFERRED EMBODIMENTS

Figure 1:
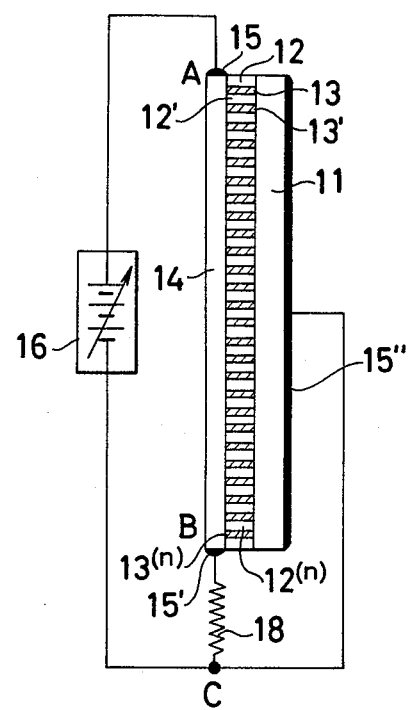
FIG. 1 is a schematic elevational view of one embodiment of a display device according to the present invention, the areas of the components of the light-emitting diode structure being greatly exaggerated for purposes of illustration.

Referring to FIG. 1, there is shown one embodiment of a display device including an N type semiconductor crystal body in the form of an elongated thin plate 11 and a large number of P type semiconductor crystal elements 12, 12', ..., 12$^{(n)}$ separated from each other by respective insulator elements 13, 13', ..., 13$^{(n-1)}$ which are positioned in side-by-side diffusion-contact relation to the N type semiconductor plate 11 to establish n number of P-N junctions at the interfaces of the N type and P type semiconductor materials along the entire length of the plate 11. A resistor plate 14 of the same length as that of the plate 11 is electrically connected to all the P type semiconductor elements 12, 12', ..., 12$^{(n)}$ at the opposite ends thereof to those contacting with the plate 11. First and second electrodes 15 and 15' are ohmically connected to respective ends of the resistor plate 14. A third electrode 15'' is ohmically connected along the entire length of the N type semiconductor plate 11 at the side opposite to that contacting with the P type semiconductor elements 12. The first electrode 15 is connected to the positive terminal of a variable voltage source 16, and the second electrode 15' is connected to a resistor 18 for providing an adjusted basic potential to the resistor plate 14 and therefrom connected to a common lead of the third electrode 15'' which is connected to the negative terminal of the voltage source 16. The light-emitting diode structure with the components 11, 12, 13 and 14 are supported on a common substrate.

With the device of FIG. 1, when a voltage of having a magnitude to be displayed is applied across the first and second electrodes 15 and 15' or the resistor plate 14, while permitting a negative potential to appear at the third electrode 15'', a potential gradient is established in the resistor 14 along the entire length thereof. Accordingly, the P-N junctions have applied forward bias voltages with progressively lower magnitudes in the direction in which current flows through the resistor 14, or from the top to the bottom as viewed in FIG. 1. Since forward bias voltage higher than the threshold voltage level for injection of minority carriers into the P and N regions lead to the occurrence of recombination of conduction electrons and holes at or near the corresponding P-N junctions, resulting in emission of light, a number of P-N junctions, when viewed consecutively from the top, will be caused to become luminous. This depends upon the actual value of the voltage-applied across the resistor 14, as shown in FIGS. 2(a) and 2(b), provided that the energy gap at the interface of the P and N regions is adjusted by use of GaAs, for example, as doped in the N type and P type semiconductor crystal structures, so that the omitted energy will fall within a visible spectral range.

Figure 2:
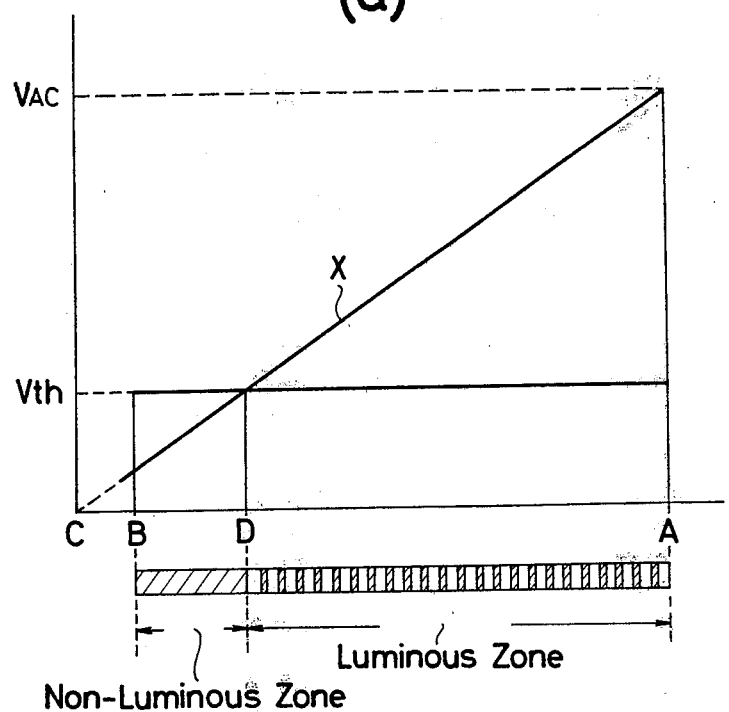
FIG. 2(a) and 2(b) diagrammatically and graphically illustrate the effect on the length of a luminous zone of the light-emitting diode structure of FIG. 1 when the voltage is varied.
Figure 2:
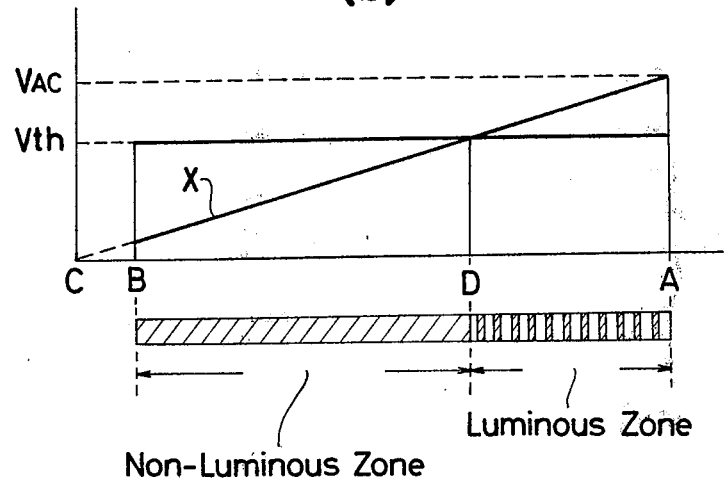

FIG. 2 shows graphical representation of the effect of variation of the voltage of the source 16 on the length of a luminous zone of the light-emitting diode structure of FIG. 1, wherein the abscissa represents position along the longitudinal length of the LED, and the ordinate represents the voltage of the variable voltage source, $V_{Ac}$, with the threshold voltage of the P-N junction being indicated at Vth. The three positions designated A, B and C correspond to those shown in FIG. 1. The curve X represents the voltage gradient. Now assuming that there is no voltage drop in the N type semiconductor crystal body 11 and the P type semiconductor crystal elements, $12, 12', \ldots, 12^{(n)}$, the voltage illustrated by the curve X is applied to the P-N junction without any loss of voltage. When this voltage is higher than the threshold voltage level Vth, emission of light results, such as for a zone between the point A and a point D at which the curve X and line Vth intersect, while the remaining zone is left in a non-luminous state. FIG. 2(a) is the case where the voltage $V_{Ac}$ of the variable voltage source 16 is selected to be high with the resulting length of a luminous zone being long, and FIG. 2(b) is the case where the voltage $V_{Ac}$ is low, with the resulting length of a luminous zone being shorter than that of FIG. 2(a). In other words, by decreasing the voltage $V_{Ac}$, the boundary D between the luminous and dark zones is moved to the right. Therefore, in order to display photographic information, a voltage proportional to the photographic information may be applied as the voltage $V_{Ac}$, thereby the boundary D between the luminous and dark zones is varied. Thus, the LED structure can display the photographic information in a bar-like form. In this device, the LED is formed by combination of a plurality of P type semiconductors 12 and insulators 13, so that when the division of the structure is made finer, it is possible to effect display in a nearly non-discontinuous or substantially analogue form. It is to be noted here that the insulators $13, 13', \ldots, 13^{(n-1)}$ function to prevent occurrence of a phenomenon where currents flowing through the P type semiconductor elements will, as a result of "cross-talk", be parallel with the N type semiconductor strip 11. Thus, without the insulators, a leak current will occur from the luminous zone to the dark zone and cause the dark zone to become luminous.

Figure 3:
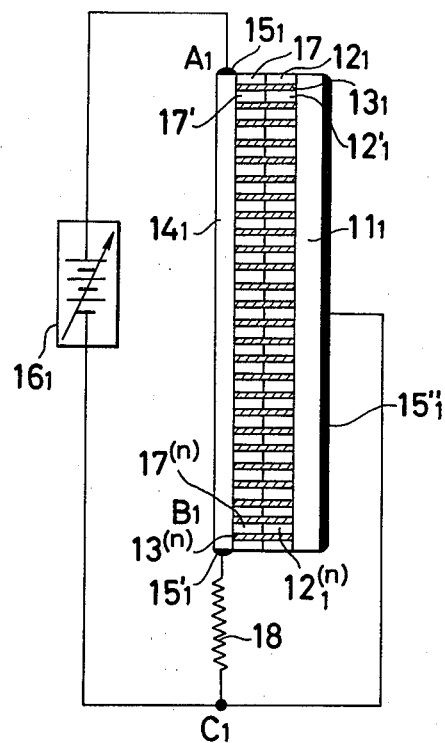
FIGS. 3 and 4 are schematic elevational views showing alternative embodiments of the present invention.

Next, FIG. 3 shows another embodiment of the present invention which is different from the embodiment of FIG. 1 in the construction of the P type semiconductor section. In the figure, the same reference characters have been employed to denote similar parts to those shown in FIG. 1. As shown in FIG. 3, the P type semiconductor elements $12_1, 12_1' \ldots, 12_1^{(n)}$ are provided with respective resistor elements $17, 17', \ldots, 17^{(N)}$ connected in series thereto and adjacent the resistor stripe 14 and having progressively smaller resistance values in that order. This is done so that the currents flowing through the successive P-N junctions are made equal to one another with the result that the luminous zone is made uniform in light intensity over the entire length thereof. Otherwise, the luminance would be decreased according to different positions measured from the top or the position A, because the nearer the position of the P-N junction to the first electrode 15, the higher the bias voltage is applied thereacross. This gives the viewer an unpleasant impression which may be encountered when the LED structure of FIG. 1 is employed.

Figure 4:
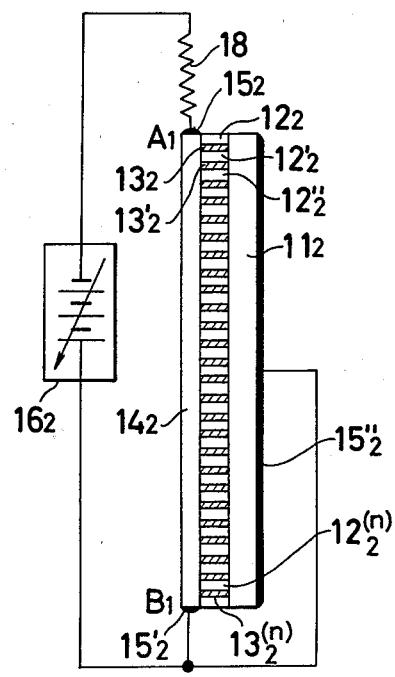

FIG. 4 shows still another embodiment of the present invention which is different from that of FIG. 1. Here, the P and N regions are interchanged, while the connection of the driving voltage source 16 to the LED structure is reversed in polarity. In FIG. 4, the areas $12_2, 12_2', \ldots, 12_2^{(n)}$ are of an N type semiconductor material, and the area $11_2$ is of a P type semiconductor material. The insulator area $13_2, 13_2', \ldots, 13_2^{(n-1)}$ remain substantially unchanged. In order to make uniform the luminances of the LED elements, the same feature as that shown in FIG. 2 may be applied to this embodiment of FIG. 3.

In connection with the above mentioned embodiments, it should be noted that the first semiconductor is not necessarily constructed in such continuous form, but may be divided to a number of elements contiguous to the second semiconductor elements, while the individual first semiconductor elements being insulated from each other in a manner such as that for the second semiconductor elements.

Figure 5:
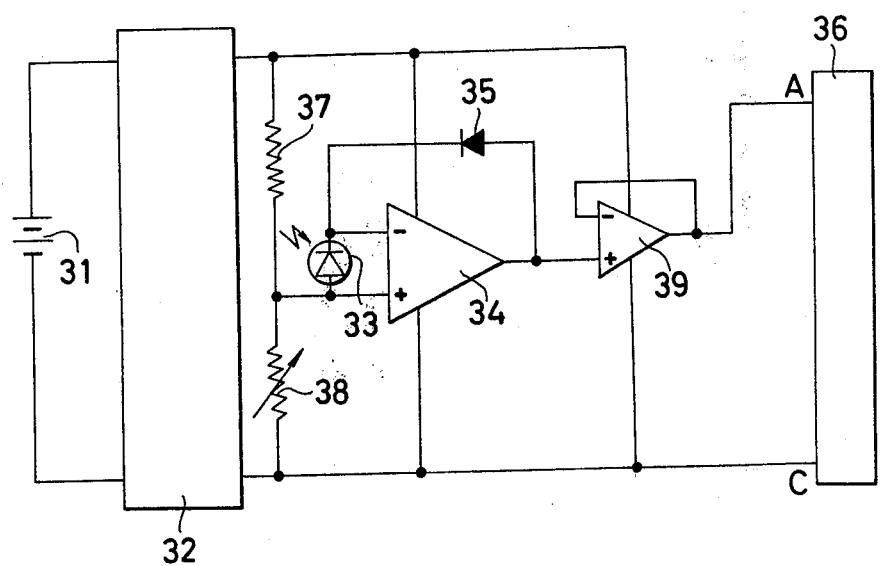
FIG. 5 is an electrical circuit diagram of an example of a display system for displaying an exposure value (e.g. proper diaphragm aperture value) which system includes the light-emitting diode structure of FIGS. 1, 3 or 4.

FIG. 5 shows an example of application of the light-emitting diode (LED) of the present invention to the light value display of a camera. The light value display system comprises an electrical power source or battery 31, a DC booster 32 of known construction, a photovoltaic cell 33 such as a silicon photo-cell, an operational amplifier 34 having two input terminals between which the photo-voltaic cell 33 is connected and having a logarithmic compression element 35 connected in the feedback network thereof, a voltage divider of a fixed resistor 37 and a variable resistor 38 connected in series to each other and across the battery 31 through the DC booster 32 and having an output terminal connected to the non-inverting input terminal of the operational amplifier 34. The variable resistor 38 serves to set various exposure control factors such as film speed, shutter speed and maximum possible lens aperture or F-number. A non-inversion type operation amplifier 39 functions as a buffer circuit and of which the output terminal is connected to the first electrode 15 at the point A of the LED structure 36 of the invention.

In the operation of the system of FIG. 5, the silicon photodiode 33 responsive to light coming from an object to be photographed produces a photo-current with a magnitude proportional to the intensity of light which is applied to the operational amplifier 34 to produce an output voltage proportional to the logarithm of the light value sensed by the SPC 33. This output voltage is applied through the buffer circuit 39 to the input terminal A (or A') of the LED structure 36, while the opposite terminal C of the LED structure 36 is connected to the circuit ground. Thus, the light value is displayed by the corresponding length of a luminous zone in the semiconductor stripe as can be seen from FIGS. 1 to 4. If the operator desires to check the actual voltage level of the battery 31, the battery 31 will be connected either directly or through a suitable intermediary element (not shown) to the LED structure 36, though such switching circuit is not shown in FIG. 5.

Figure 6:
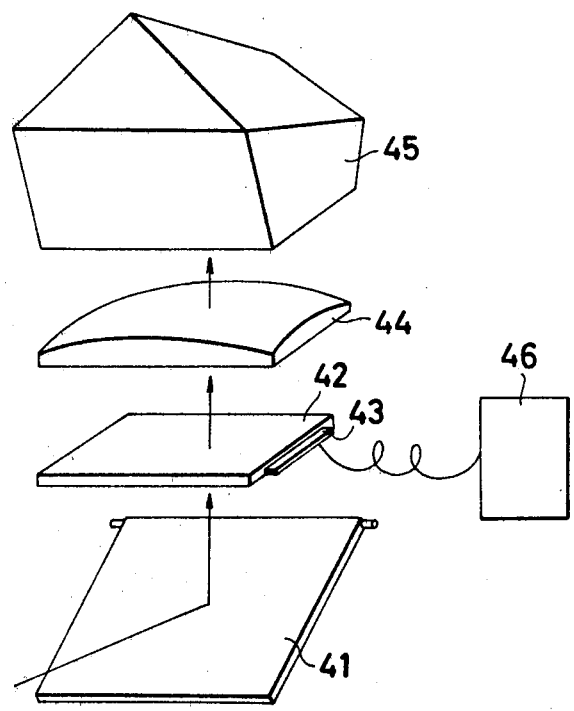
FIG. 6 is an exploded perspective view of the basic parts of a finder optical system of a single lens reflex camera to which the display system of FIG. 5 is applied.

FIG. 6 shows an example of arrangement of the LED structure in a finder optical system of a single lens reflex camera. The finder optical system includes a quick-return reflex mirror 41, a focusing screen 42 carrying the LED structure 43 of the invention at one side thereof, a condenser lens 44 and a penta prism 45. These optical elements 41, 42, 44 and 45 are aligned along a common optical axis. A block 45 is a driving circuit for the LED structure 43 such as that shown in FIG. 5 which is positioned to occupy a suitable space within the camera housing.

Figure 7:
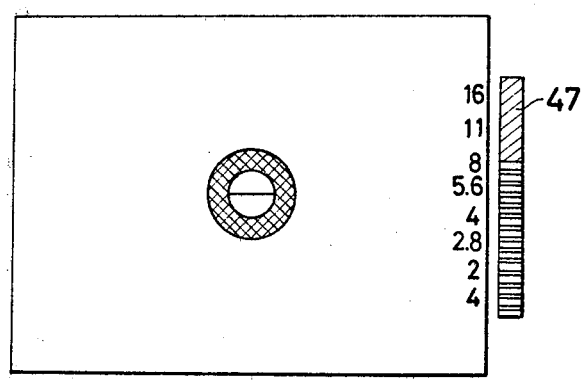
FIG. 7 is a plan view showing an example of arrangement of an image of the light-emitting diode structure for cooperation with a diaphragm value scale at a marginal portion of the field of view of the finder of FIG. 6.

FIG. 7 shows an example of the field of view of the finder of FIG. 6 in which an image of the LED structure 43 appears adjacent a diaphragm value scale, the latter being located at a marginal portion of the field of the finder view. In this case, the boundary between the luminous and dark zones occurs in alignment with a graduation which is representative of a proper diaphragm value F8 as a result of computation by the light metering circuit of FIG. 5.

It will be seen from the foregoing that the present invention contemplates the use of a light-emitting diode structure in displaying an information in an analogue form similar to that employed in the display system using a galvanometer. Because of utilization of the light emitting phenomenon, it is made possible to read out the display even when the given photographic situation is dark.

What is claimed is:

1. A light-emitting display device comprising:
an electrical power source; and
a light-emitting diode structure having:
    (a) a first semiconductor layer of a first conductivity type, said layer having first and second faces;
    (b) each of a plurality of second semiconductor layers having a conductivity type opposite to that of the first conductivity type being arranged alternately with each of a plurality of insulating layers along the first semiconductor layer to form respective P-N junctions with the first semiconductor layer;
    (c) a first electrode arranged in contact with the face of the first semiconductor layer opposite to its face forming P-N junctions for receiving a certain voltage;
    (d) a resistor arranged in contact with a face of each of the second semiconductor layers opposite to a face forming said P-N junctions and also in contact with each of said insulating layers, the conductance of the resistor being set relatively larger than the nominal direction conductance of said P-N junctions; and
    (e) second and third electrodes for receiving a variable signal voltage connected to said resistor at respective end portions thereof, said end portions being arranged in a direction of the alternate arrangement of the second semiconductor layers with insulating layers,
whereby the light-emitting zone in the direction of the alternating arrangement of the light-emitting diode structure will vary with variation of the potential gradient of the resistor, which variation results from the application of said variable signal voltage.

2. A display device according to claim 1, wherein a plurality of resistor elements having resistance values progressively varying in the direction of the alternative arrangement being arranged between said second semiconductor layers with insulating layers and the resistor layer.

3. A display device according to claim 1, further comprising a means for supplying the variable signal voltage.

4. A display device according to claim 1, wherein said light-emitting diode structure is arranged in a finder optical system of a camera so that variation of the light-emitting zone of said light-emitting diode structure will display photographic information of the camera either in a stepwise or in an almost continuous form.

5. A display device according to claim 4, wherein said camera is provided with a light measuring device including a light receiving element, and the light-emitting zone of said light-emitting diode structure is arranged to vary with the brightness of light incident upon said light receiving element.

6. A light-emitting display device comprising:
an electrical power source; and
a light-emitting diode structure having:
    (a) a first semiconductor layer of a first conductivity type, said layer having first and second faces;
    (b) each of a plurality of second semiconductor layers having a conductivity type opposite to that of the first conductivity type being arranged alternately with each of a plurality of insulating layers along the first semiconductor layer to form respective P-N junctions with the first semiconductor layer;
    (c) a first electrode arranged in contact with the face of the first semiconductor layer opposite to its face forming P-N junctions for receiving a certain voltage;
    (d) a resistor arranged in contact with a face of each of the second semiconductor layers opposite to a face forming said P-N junctions and also in contact with each of said insulating layers, the conductance of the resistor being set relatively larger than the nominal direction conductance of said P-N junctions;
    (e) second and third electrodes for receiving a variable signal voltage connected to said resistor at respective end portions thereof, said end portions being arranged in a direction of the alternate arrangement of the second semiconductor layers with insulating layers; and
    (f) means for restricting the current, arranged between the resistor and the second semiconductor so as to restrict the current amount passing to the P-N junctions to pre-establish a correlation with the total current amount passing through the resistor,
whereby the light-emitting zone in the direction of the alternating arrangement of the light-emitting diode structure will vary with variation of the potential gradient of the resistor, which variation results from the application of said variable signal voltage.

7. A light-emitting display device according to claim 6, wherein a plurality of resistor elements having resistance values progressively varying in the direction of the alternative arrangement being arranged between said second semiconductor layers with insulating layers and the resistor layer, whereby the current passing to the P-N junctions is restricted so as to be almost uniform.

8. A light-emitting display device according to claim 6, further comprising means for supplying the variable signal voltage.

9. A light-emitting display device according to claim 6, wherein said light-emitting diode structure is arranged in a finder optical system of a camera so that variation of the light-emitting zone of said light-emitting diode structure will display photographic information of the camera either in a stepwise or in an almost continuous form.

10. A light-emitting display device according to claim 6, wherein said camera is provided with a light measuring device including a light receiving element, and the light-emitting zone of said light-emitting diode structure is arranged to vary with the brightness of light incident upon said light receiving element.

* * * * *